United States Patent
Guo

(10) Patent No.: US 12,082,444 B2
(45) Date of Patent: Sep. 3, 2024

(54) DISPLAY DEVICE AND MANUFACTURING METHOD OF DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Wanghui Guo, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 586 days.

(21) Appl. No.: 17/417,443

(22) PCT Filed: May 10, 2021

(86) PCT No.: PCT/CN2021/092814
§ 371 (c)(1),
(2) Date: Jun. 23, 2021

(87) PCT Pub. No.: WO2022/227114
PCT Pub. Date: Nov. 3, 2022

(65) Prior Publication Data
US 2022/0359626 A1    Nov. 10, 2022

(30) Foreign Application Priority Data

Apr. 25, 2021   (CN) .......................... 202110447513.7

(51) Int. Cl.
*H10K 59/122*        (2023.01)
*H10K 50/84*         (2023.01)
(Continued)

(52) U.S. Cl.
CPC ........... *H10K 59/122* (2023.02); *H10K 50/84* (2023.02); *H10K 50/865* (2023.02); *H10K 59/38* (2023.02); *H10K 71/00* (2023.02); *H10K 59/1201* (2023.02)

(58) Field of Classification Search
CPC ......... H10K 50/865; H10K 59/12–221; H10K 59/122
See application file for complete search history.

(56) References Cited

U.S. PATENT DOCUMENTS

2020/0357871 A1    11/2020   Chung et al.
2021/0202627 A1*   7/2021    Kim ..................... H10K 59/126
(Continued)

FOREIGN PATENT DOCUMENTS

CN   110707132 A   1/2020
CN   110767686 A   2/2020
(Continued)

*Primary Examiner* — Eric A. Ward
(74) *Attorney, Agent, or Firm* — Rivka Friedman

(57) ABSTRACT

The present application provides a display device and a manufacturing method thereof. The display device includes a transparent display region and a main display region. The display device further includes a pixel defining layer. The pixel defining layer includes a first pixel defining layer and a second pixel defining layer. The first pixel defining layer is positioned in the transparent display region. The second pixel defining layer is positioned in the main display region. An absorbance of the first pixel defining layer is less than an absorbance of the second pixel defining layer.

16 Claims, 7 Drawing Sheets

(51) Int. Cl.
  *H10K 50/86* (2023.01)
  *H10K 59/38* (2023.01)
  *H10K 71/00* (2023.01)
  *H10K 59/12* (2023.01)

(56) References Cited

U.S. PATENT DOCUMENTS

2022/0045144 A1* 2/2022 Lee ............... H10K 50/822
2022/0130915 A1* 4/2022 Son ............... H10K 59/65

FOREIGN PATENT DOCUMENTS

| CN | 110767720 A | 2/2020 |
| CN | 111430426 A | 7/2020 |
| CN | 111834417 A | 10/2020 |
| CN | 111834432 A | 10/2020 |
| CN | 111863900 A | 10/2020 |
| CN | 112259580 A | 1/2021 |

* cited by examiner

DISPLAY DEVICE AND MANUFACTURING METHOD OF DISPLAY DEVICE

FIELD OF INVENTION

The present application is related to the field of display technology and specifically to a display device and a manufacturing method of the display device.

BACKGROUND OF INVENTION

In order to increase screen-to-body ratios and realize full-screen displays, technology of placing a photosensitive module such as a camera under a display panel has become a mainstream. However, because the display panel above the photosensitive module has multiple film layers, a light transmittance is low. As a result, the photosensitive module has poor photosensitivity, and a performance of the photosensitive module is affected. In addition, a light transmittance of a polarizer is as low as 43%. A solution replacing the polarizer (POL) with color filters called POL-less technology can cooperate with an under-screen photosensitive module to greatly enhance a performance of the under-screen photosensitive module. A POL-less display device in prior art includes a pixel defining layer with a light-shielding effect. The pixel defining layer with the light-shielding effect has a low light transmittance, so a region above the photosensitive module with the low light transmittance also causes a performance degradation problem.

SUMMARY OF INVENTION

In view of problems of prior art, a purpose of the present application is to provide a display device and a manufacturing method of the display device that can increase a light transmittance of a region above a photosensitive module, thereby enhancing a performance of the photosensitive module.

A display device provided by the present application includes a transparent display region and a main display region. The main display region is adjacent to the transparent display region. The display device further includes:
  a substrate;
  a pixel defining layer disposed on the substrate and defined with openings, wherein the pixel defining layer includes a first pixel defining layer and a second pixel defining layer, the first pixel defining layer is positioned in the transparent display region, the second pixel defining layer is positioned in the main display region, and an absorbance of the first pixel defining layer is less than an absorbance of the second pixel defining layer; and
  light-emitting pixels disposed in the openings.

In an embodiment, a ratio of the absorbance of the first pixel defining layer to the absorbance of the second pixel defining layer ranges from one-half to two-thirds.

In an embodiment, an absolute value of a difference between a reflectance of the first pixel defining layer and a reflectance of the second pixel defining layer is less than or equal to two percent.

In an embodiment, a thickness of the first pixel defining layer is less than a thickness of the second pixel defining layer.

In an embodiment, a ratio of the thickness of the first pixel defining layer to the thickness of the second pixel defining layer ranges from one-half to two-thirds.

In an embodiment, a material of the first pixel defining layer and a material of the second pixel defining layer are different. An absorbance of the material of the first pixel defining layer is less than an absorbance of the material of the second pixel defining layer.

In an embodiment, the first pixel defining layer includes a first pixel defining portion and a second pixel defining portion disposed on the substrate. An absorbance of the second pixel defining portion is less than an absorbance of the first pixel defining portion.

In an embodiment, the absorbance of the second pixel defining layer is equal to the absorbance of the first pixel defining portion.

In an embodiment, the display device further includes:
  an encapsulation layer disposed on a side of the light-emitting pixels away from the pixel defining layer;
  a color filter layer disposed on a side of the encapsulation layer away from the light-emitting pixels, wherein the color filter layer includes a plurality of color filters, the pixel defining layer includes a plurality of pixel defining portions, and each of the pixel defining portions corresponds to a gap between two adjacent color filters; and
  a planarization layer covering a side of the color filter layer away from the encapsulation layer, wherein the planarization layer is filled in the gap in the transparent display region.

In an embodiment, the display device further includes a touch control module. The touch control module is positioned in the main display region and is disposed between the encapsulation layer and the color filter layer. The color filter layer further includes a black matrix positioned in the main display region and filled in the gap between two adjacent color filters.

A manufacturing method of a display device provided by the present application includes steps of:
  providing a substrate including a first region and a second region adjacent to the first region;
  forming a light-shielding material layer on the substrate, patterning the light-shielding material layer to form a pixel defining layer, and defining openings in the pixel defining layer, wherein the pixel defining layer includes a first pixel defining layer and a second pixel defining layer, the first pixel defining layer is positioned in the first region, the second pixel defining layer is positioned in the second region, and an absorbance of the first pixel defining layer is less than an absorbance of the second pixel defining layer; and
  forming light-emitting pixels in the openings.

In an embodiment, a ratio of the absorbance of the first pixel defining layer to the absorbance of the second pixel defining layer ranges from one-half to two-thirds.

In an embodiment, an absolute value of a difference between a reflectance of the first pixel defining layer and a reflectance of the second pixel defining layer is less than or equal to two percent.

In an embodiment, in the step of forming the light-shielding material layer on the substrate, patterning the light-shielding material layer to form the pixel defining layer, and the defining openings in the pixel defining layer includes a step of:
  obtaining the first pixel defining layer and the second pixel defining layer with different thicknesses by a halftone mask or a grayscale mask, wherein a thickness of the first pixel defining layer is less than a thickness of the second pixel defining layer.

In an embodiment, a ratio of the thickness of the first pixel defining layer to the thickness of the second pixel defining layer ranges from one-half to two-thirds.

In an embodiment, a material of the first pixel defining layer and a material of the second pixel defining layer are different. An absorbance of the material of the first pixel defining layer is less than an absorbance of the material of the second pixel defining layer.

In an embodiment, the first pixel defining layer includes a first pixel defining portion and a second pixel defining portion disposed on the substrate. An absorbance of the second pixel defining portion is less than an absorbance of the first pixel defining portion.

In an embodiment, the absorbance of the second pixel defining layer is equal to the absorbance of the first pixel defining portion.

In an embodiment, after the step of forming the light-emitting pixels in the openings, the manufacturing method of the display device further includes steps of:

forming an encapsulation layer on a side of the light-emitting pixels away from the pixel defining layer;

forming a color filter layer on a side of the encapsulation layer away from the light-emitting pixels, wherein the color filter layer includes a plurality of color filters, the pixel defining layer includes a plurality of pixel defining portions, and each of the pixel defining portions corresponds to a gap between two adjacent color filters; and forming a planarization layer on a side of the color filter layer away from the encapsulation layer, wherein the planarization layer is filled in the gap in the first region.

In an embodiment, after the step of forming the encapsulation layer on the side of the light-emitting pixels away from the pixel defining layer and before the step of forming the color filter layer on the side of the encapsulation layer away from the light-emitting pixels, the manufacturing method of the display device further includes a step of:

forming a touch control module in the first region, wherein the touch control module is disposed between the encapsulation layer and the color filter layer.

The display device of the present application includes the transparent display region and the main display region. The main display region is adjacent to the transparent display region. The display device further includes the substrate, the pixel defining layer, and the light-emitting pixels. The pixel defining layer is disposed on the substrate. The pixel defining layer is defined with the openings. The pixel defining layer includes the first pixel defining layer and the second pixel defining layer. The first pixel defining layer is positioned in the transparent display region. The second pixel defining layer is positioned in the main display region. The absorbance of the first pixel defining layer is less than the absorbance of the second pixel defining layer. The light-emitting pixels are disposed in the openings.

DESCRIPTION OF DRAWINGS

In order to describe technical solutions in the present application clearly, drawings to be used in the description of embodiments will be described briefly below. Obviously, drawings described below are only for some embodiments of the present application, and other drawings can be obtained by those skilled in the art based on these drawings without creative efforts.

DETAILED DESCRIPTION OF EMBODIMENTS

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the of the present application.

In the present application, unless explicitly stated and limited, the first feature is "on" or "under" the second feature may refer to that the first feature and second feature are directly contact, or are indirectly through another feature between them. Moreover, the first feature is "above", "upon", and "upper" the second feature, including that the first feature is directly above and obliquely above the second feature refers to that t the first feature is higher in level than the second feature. The first feature is "below", "down", and "under" of the second feature refers to that the first feature is directly below or obliquely below the second feature, or merely refers to that the first feature is horizontally lower than the second feature.

Figure 1:
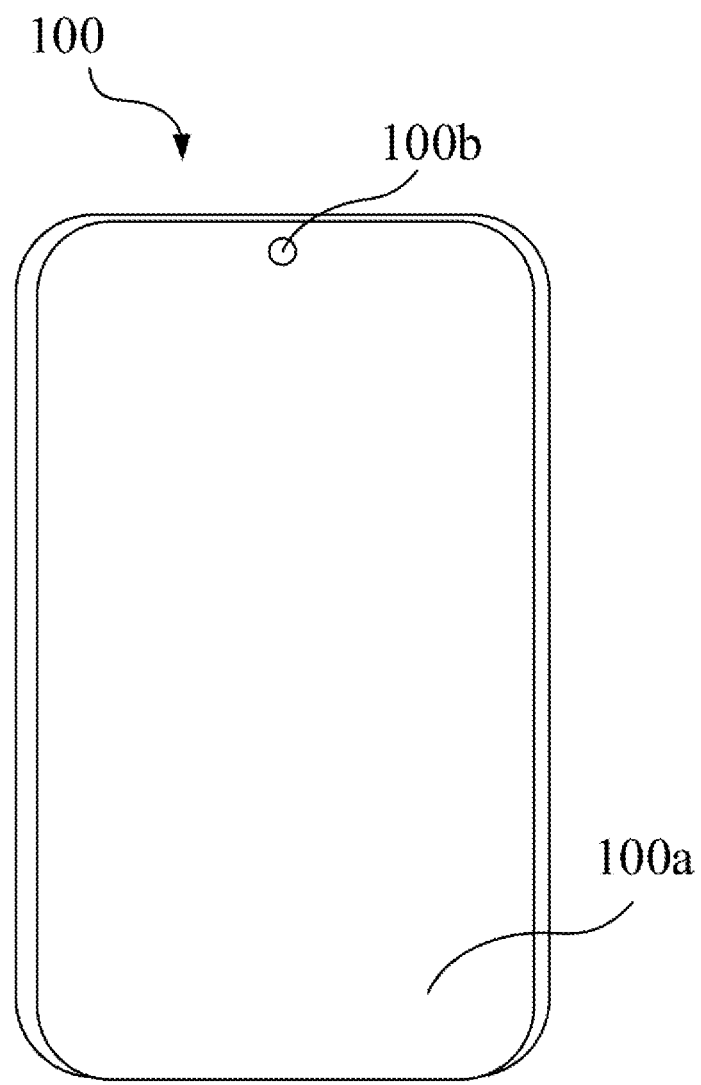
FIG. 1 is a schematic diagram of a top view of a display device provided by an embodiment of the present application.

Please refer to FIG. 1, which is a schematic diagram of a top view of a display device provided by an embodiment of the present application. A display device 100 can be an electronic device with a display function such as a mobile phone, a tablet computer, a notebook, a game console, a digital camera, a car navigation system, an electronic billboard, and an automatic teller machine.

The display device 100 is an organic light-emitting diode (OLED) display device 100. The OLED display device can be one of an active matrix organic light-emitting diode (AMOLED) display device, a passive matrix organic light-emitting diode (PMOLED) display device, or a quantum dot light-emitting diode (QLED) display device.

The display device 100 is a POL-less display device, which is a display device replacing a polarizer with color filters. This can not only reduce a thickness of functional layers of the display device 100, but also increase a light extraction rate. In addition, POL-less technology based on the color filters is considered to be one of key technologies for development of dynamic bending products. Specific structures of the display device 100 are described in detail below.

The display device 100 includes a transparent display region 100a and a main display region 100b. The main display region 100b is adjacent to the transparent display region 100a. The main display region 100b is configured to display images. The display device 100 further includes a photosensitive module 101. The photosensitive module 101 corresponds to the transparent display region 100a and is positioned in the non-display side 100a1 of the transparent display region 100a. When the photosensitive module 101 is turned on, the transparent display region 100a is in a light-transmitting state to allow light to enter the photosensitive module 101. When the photosensitive module 101 is turned off, the transparent display region 100a is in a display state and displays images together with the main display region 100b to realize a full-screen display. In the present application, the display device 100 further includes a bending region 100c. The bending region 100c is configured to bend to a back of the display device 100 to electrically connect a circuit board. The bending region 100c is positioned on a side of the main display region 100b away from the transparent display region 100a. In an embodiment, the main display region 100b surrounds the transparent display region 100a. The transparent display region 100a is positioned on an upper side of the display device 100. However, the present application does not limit shapes and relative positions of the main display region 100b and the transparent display region 100a.

Figure 2:
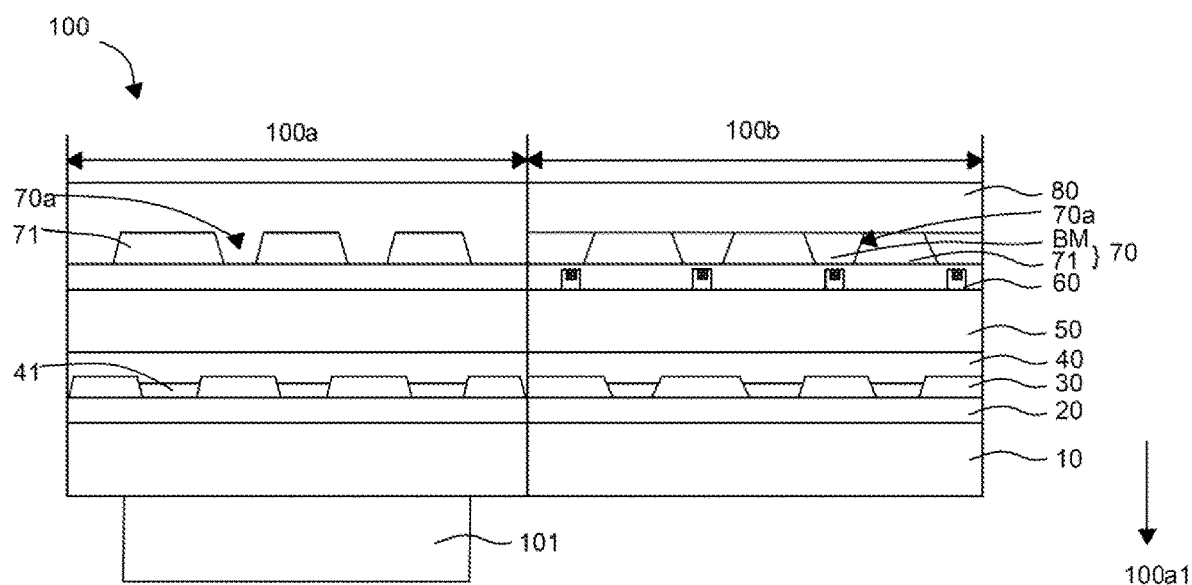
FIG. 2 is a structural schematic diagram of the display device shown in FIG. 1.
Figure 3:
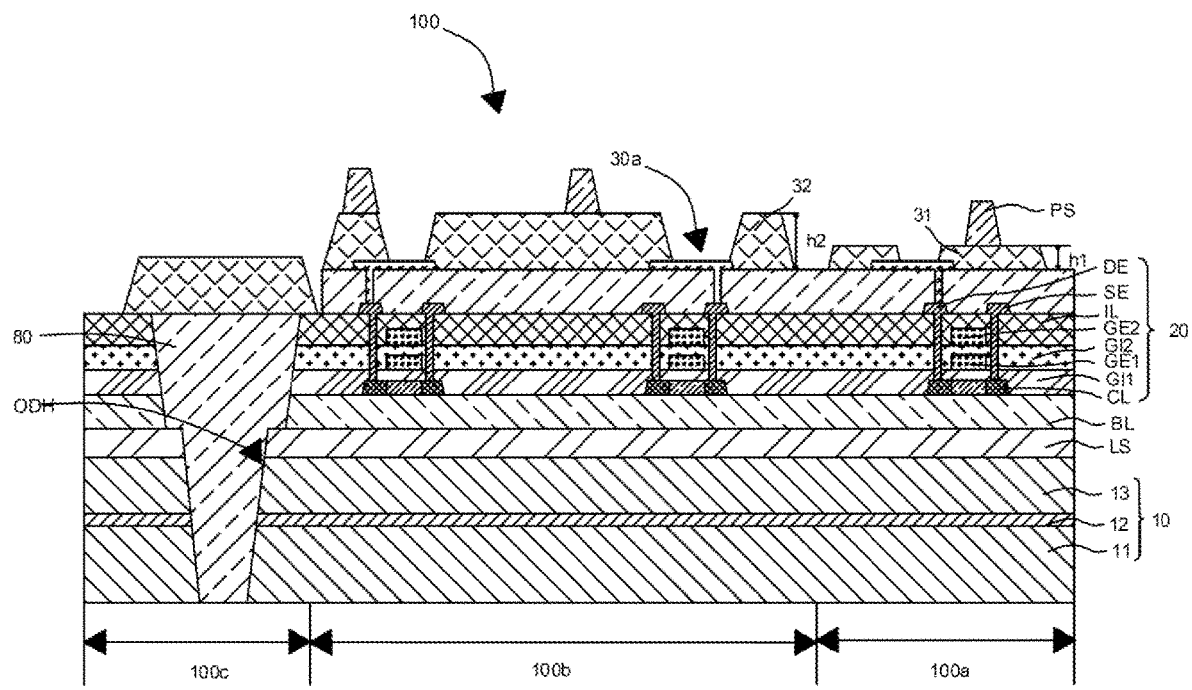
FIG. 3 is a schematic diagram of a partial cross-sectional view of the display device shown in FIG. 1.

Please refer to FIG. 2 and FIG. 3 together. FIG. 2 is a structural schematic diagram of the display device shown in FIG. 1. FIG. 3 is a schematic diagram of a partial cross-sectional view of the display device shown in FIG. 1.

The display device 100 includes a substrate 10, a driving circuit layer 20, a pixel defining layer 30, light-emitting pixel layer 40, an encapsulation layer 50, a touch control module 60, a color filter layer 70, and a planarization layer 80. The driving circuit layer 20, the pixel defining layer 30, the light-emitting pixel layer 40, the encapsulation layer 50, the touch control module 60, the color filter layer 70, and the planarization layer 80 are sequentially stacked on the substrate 10. Both the main display region 100b and the transparent display region 100a include film layers for display, such as the substrate 10, the driving circuit layer 20, the pixel defining layer 30, the light-emitting pixel layer 40, the encapsulation layer 50, the touch control module 60, the color filter layer 70, and the planarization layer 80. The bending region 100c can exclude functional film layers for display, such as the driving circuit layer 20, the pixel defining layer 30, the light-emitting pixel layer 40, the encapsulation layer 50, the touch control module 60, and the color filter layer 70, and is configured to distribute traces. The display device 100 can further include components which are not shown, such as a frame and a backplane, and will not be repeatedly described herein.

The substrate 10 can be a rigid substrate such as a glass substrate and a plastic substrate, or can be a flexible substrate. The flexible substrate can include a single layer of a flexible organic layer, or can include two or more layers of the flexible organic layer and a blocking layer disposed between two adjacent flexible organic layers. A material of the flexible organic layer is selected from one or more of polyimide (PI), polyethylene naphthalate (PEN), polyethylene terephthalate (PET), polyarylate (PAR), polycarbonate (PC), polyetherimide (PEI), and polyethersulfone (PES). A material of the blocking layer is selected from one or more of inorganic materials such as silicon dioxide and silicon nitride. In an embodiment, the substrate 10 includes a first polyimide layer 11, the blocking layer 12, and a second polyimide layer 13 sequentially stacked.

The driving circuit layer 20 is disposed on the substrate 10. The driving circuit layer 20 is configured to drive the light-emitting pixel layer 40 to emit light. The driving circuit layer 20 includes a driving circuit. The driving circuit can be a driving circuit commonly used in the art, such as a 7T1C circuit or a 5T1C circuit. The driving circuit includes a thin-film transistor. Specifically, in this embodiment, the thin-film transistor is a double-gate thin-film transistor. The thin-film transistor includes an active layer CL, a first gate insulating layer GI1, a first gate GE1, a second gate insulating layer GI2, a second gate GE2, an interlayer insulating layer IL, a source SE, and a drain DE sequentially stacked. The active layer CL is disposed on the substrate 10. The first gate insulating layer GI1 covers a side of the active layer CL away from the substrate 10. The first gate GE 1 is disposed on a side of the first gate insulating layer GI1 away from the active layer CL. The second gate insulating layer GI2 covers the first gate GE 1 and the first gate insulating layer GI1. The second gate GE2 is disposed on a side of the first gate insulating layer GI1 away from the first gate GE1. The interlayer insulating layer IL covers the second gate GE2 and the first gate insulating layer GI1. The source SE and the drain DE are disposed on a side of the interlayer insulating layer IL away from the first gate GE 1 and are respectively connected to both ends of the active layer CL. It can be understood that a light-shielding layer LS and a buffer layer BL can be provided between the driving circuit layer 20 and the substrate 10.

It can be understood that the present application does not limit a structure of the thin-film transistor in the driving circuit layer 20. The thin-film transistor can be a top-gate thin-film transistor, a bottom-gate thin-film transistor, the double-gate thin-film transistor shown in FIG. 1, or a single-gate thin-film transistor.

The pixel defining layer 30 is disposed on a side of the driving circuit layer 20 away from the substrate 10. The pixel defining layer 30 is configured to define a light-emitting region, has a light-shielding effect, and can prevent a light reflection. The pixel defining layer 30 is defined with openings 30a. The openings 30a are positioned in the main display region and the transparent display region. The openings 30a are configured to accommodate organic light-emitting diode devices. In an embodiment, a material of the pixel defining layer 30 is a black matrix material commonly used in the art. The material of the pixel defining layer 30 is mainly composed of a thermosensitive and photosensitive polymer and a black filler. The thermosensitive and photosensitive polymer can be acrylic resin or methacrylic resin, and the black filler can be a carbon black material, an organic light-absorbing material, etc.

In order to solve a problem of a low light transmittance of the transparent display region 100a, in an embodiment, the pixel defining layer 30 includes a first pixel defining layer 31 and a second pixel defining layer 32. The first pixel defining layer 31 is positioned in the transparent display region 100a. The second pixel defining layer 32 is positioned in the main display region 100b. An absorbance of the first pixel defining layer 31 is less than an absorbance of the second pixel defining layer 32. Furthermore, a ratio of the absorbance of the first pixel defining layer 31 to the absorbance of the second pixel defining layer 32 ranges from one-third to three-quarters. Specifically, the ratio of the absorbance of the first pixel defining layer 31 to the absorbance of the second pixel defining layer 32 is one-third, one-half, two-thirds, or three-quarters. When the ratio of the absorbance of the first pixel defining layer 31 to the absorbance of the second pixel defining layer 32 is less than this range, a difference between a light transmittance of the first pixel defining layer 31 and a light transmittance of the second pixel defining layer 32 is too large, so an uneven display (i.e., mura) is prone to occur between the transparent display region 100a and the main display region 100b. When the ratio of the absorbance of the first pixel defining layer 31 to the absorbance of the second pixel defining layer 32 is greater than this range, the light transmittance of the transparent display region 100a cannot be significantly increased. In an embodiment, the photosensitive module 101 is a camera. When the ratio of the absorbance of the first pixel defining layer 31 to the absorbance of the second pixel defining layer 32 is within a range from one-half to two-thirds, experiments show that the camera can obtain a better photography effect.

Figure 4:
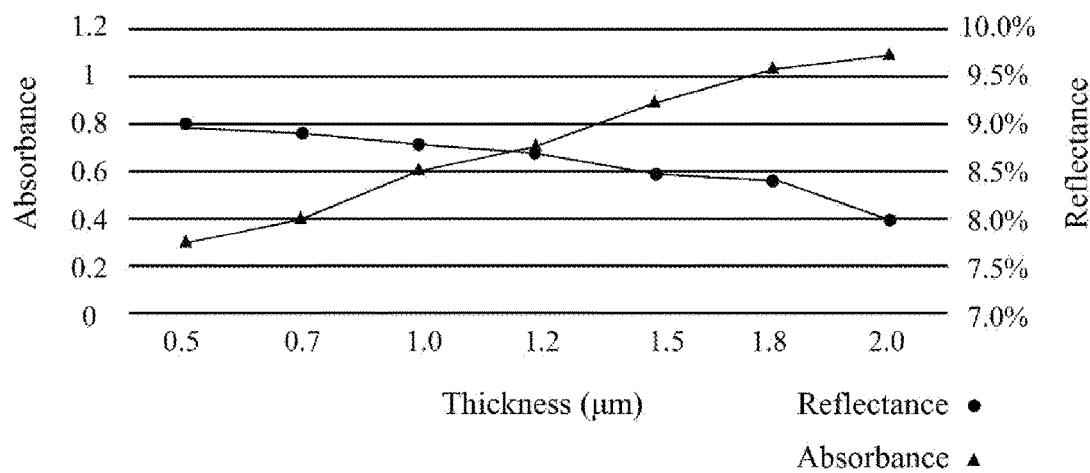
FIG. 4 is a line chart of a relationship between a thickness, an absorbance, and a reflectance of Toray DL-3811.

In the POL-less display device 100, the pixel defining layer is configured to reduce a light reflectance and a light transmittance to realize a function like the polarizer. Under-screen sensing technology requires the transparent display region 100a having a high light transmittance and a low reflectance. In order to meet requirements of both the POL-less and the under-screen sensing technologies, a difference between a reflectance of the first pixel defining layer 31 and a reflectance of the second pixel defining layer 32 is less than or equal to two percent. Let the reflectance of the first pixel defining layer 31 be R1 and the reflectance of the second pixel defining layer 32 be R2, then R1−R2≤2%. For example, referring to FIG. 4, in an embodiment, a thickness of the first pixel defining layer 31 is 1.5 microns, the reflectance of the first pixel defining layer 31 is 8.5%, a thickness of the second pixel defining layer 32 is 2 microns, and the reflectance of the second pixel defining layer 32 is 8.0%. The difference between the reflectance of the first pixel defining layer 31 and the reflectance of the second pixel defining layer 32 is 0.5% and is less than or equal to 2%. It should be explained that in the present application, with the main display region as a reference, the second pixel defining layer 32 of the main display region is a pixel defining layer that can meet conventional display requirements. In other words, performance parameters such as the absorbance and the reflectance of the second pixel defining layer 32 of the main display region are subject to meeting the conventional display requirements. Based on the absorbance and the reflectance of the second pixel defining layer 32, the absorbance and the reflectance of the first pixel defining layer 31 can be adjusted. When R1−R2>2%, and the reflectance of the first pixel defining layer 31 is too high, which cannot meet the requirements of the POL-less and the under-screen sensing technologies, which affects a sensing quality of the photosensitive module and a screen-off appearance.

Furthermore, in order to control the absorbance and the reflectance of the pixel defining layer 30, inventors have conducted research on material properties of the pixel defining layer 30. Please refer to FIG. 4, which is a relationship between a thickness, an absorbance, and a reflectance of Toray DL-3811. Toray DL-3811 can be configured as the material of the pixel defining layer 30. An abscissa is the thickness, and its unit is micron. An ordinate on a left is the absorbance, and its unit is L/(g·cm). A calculation method of the absorbance is: absorbance=log(1/light transmittance). An ordinate on a right is the reflectance, and its unit is percent. The absorbance and the thickness of the pixel defining layer 30 are negatively correlated by analyzing the material properties of the pixel defining layer 30. In other words, as the thickness of the pixel defining layer 30 increases, the absorbance increases roughly proportionally, and the light transmittance roughly decreases proportionally. Meanwhile, as the thickness of the pixel defining layer 30 increases, the reflectance does not change much.

Main determinants of the absorbance of the pixel defining layer 30 are the thickness and the material. In order to solve the problem of the low light transmittance of the transparent display region 100a, the absorbance and the reflectance of the first pixel defining layer 31 and the absorbance and the reflectance of the second pixel defining layer 32 can be adjusted by configuring the thickness h1 of the first pixel defining layer 31 and the thickness h2 of the second pixel defining layer 32. In an embodiment, a material of the first pixel defining layer 31 and a material of the second pixel defining layer 32 are same, and the thickness h1 of the first pixel defining layer 31 is less than the thickness h2 of the second pixel defining layer 32. Furthermore, a ratio of the thickness h1 of the first pixel defining layer 31 to the thickness h2 of the second pixel defining layer 32 ranges from one-third to three-quarters. Specifically, the ratio of the thickness h1 of the first pixel defining layer 31 to the thickness h2 of the second pixel defining layer 32 is one-third, one-half, two-thirds, or three-quarters.

Figure 5:
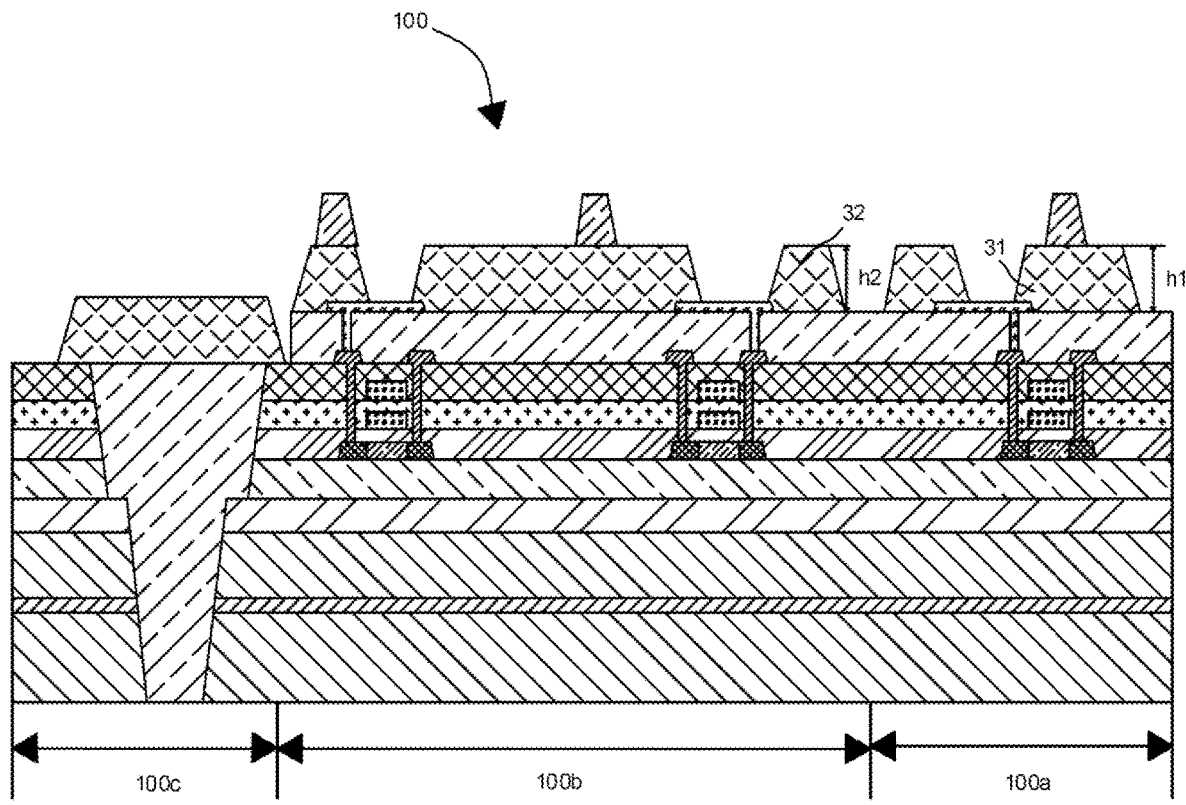
FIG. 5 is a schematic diagram of a partial cross-sectional view of a display device provided by another embodiment of the present application.

In another embodiment of the present application, the absorbance and the reflectance of the first pixel defining layer 31 and the absorbance and the reflectance of the second pixel defining layer 32 can be adjusted by selecting the materials of the first pixel defining layer 31 and the second pixel defining layer 32. In order to make the absorbance of the first pixel defining layer 31 less than the absorbance of the second pixel defining layer 32, the material of the first pixel defining layer 31 and the material of the second pixel defining layer 32 are different, and the absorbance of the material of the first pixel defining layer 31 is less than the absorbance of the material of the second pixel defining layer 32. Specifically, the thickness of the first pixel defining layer 31 and the thickness of the second pixel defining layer 32 can be same or different. Please refer to FIG. 5, which is a schematic diagram of a partial cross-sectional view of a display device provided by another embodiment of the present application. In order to simplify manufacturing processes, the thickness of the first pixel defining layer 31 and the thickness of the second pixel defining layer 32 are same.

Figure 6:
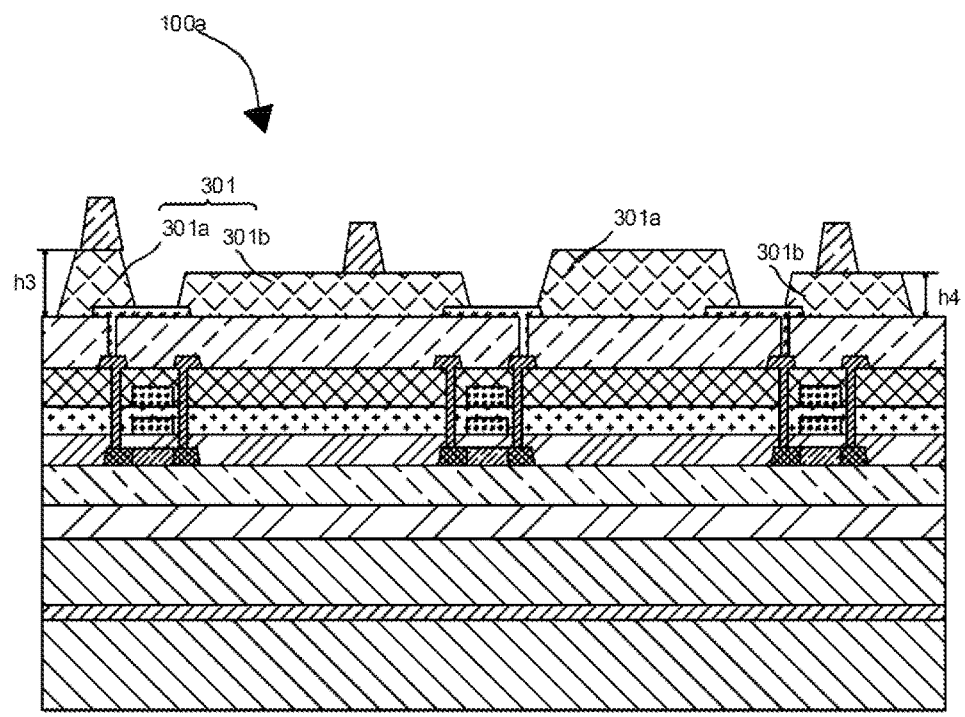
FIG. 6 is a schematic diagram of a partial cross-sectional view of a display device provided by yet another embodiment of the present application.
Figure 7:
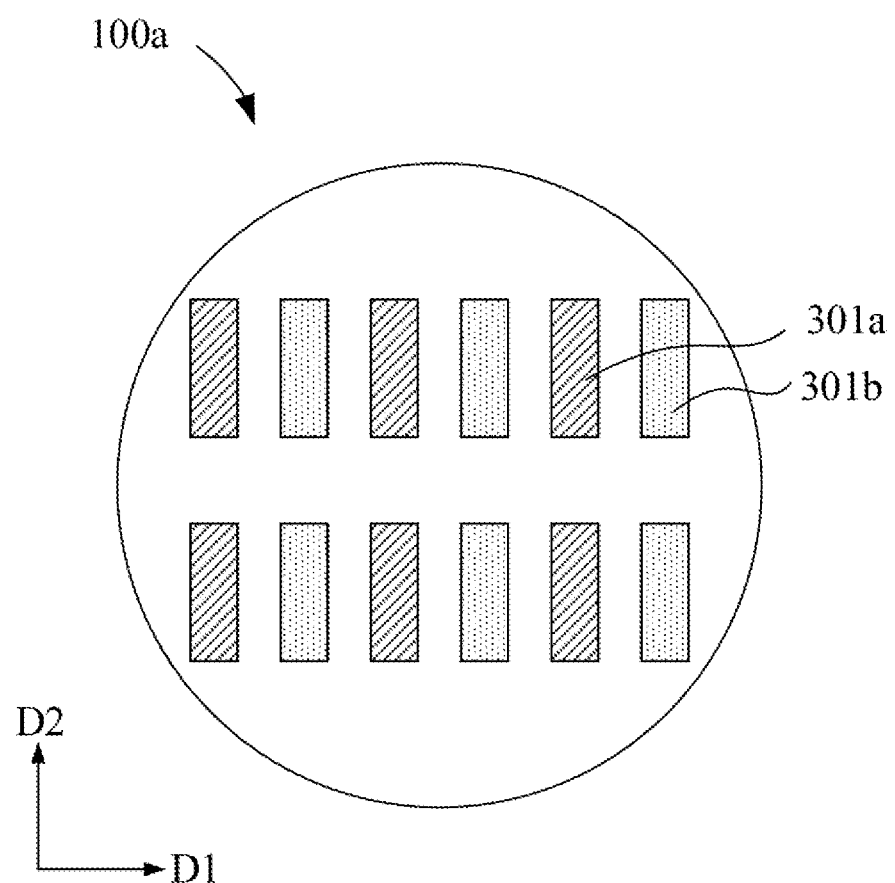
FIG. 7 is a schematic diagram of a top view of a first pixel defining layer shown in FIG. 6.

Please refer to FIGS. 6 and 7. FIG. 6 is a schematic diagram of a partial cross-sectional view of a display device provided by yet another embodiment of the present application. FIG. 7 is a schematic diagram of a top view of the first pixel defining layer shown in FIG. 6. In yet another embodiment of the present application, the absorbance and the reflectance of the first pixel defining layer 31 can be adjusted by designing a structure of the first pixel defining layer 31. In order to make the absorbance of the first pixel defining layer 31 less than the absorbance of the second pixel defining layer 32, the pixel defining layer 30 includes a plurality of pixel defining portions 301. Each of the pixel defining portions 301 includes a first pixel defining portion 301a and a second pixel defining portion 301b arranged on the substrate 10. An absorbance of the second pixel defining portion 301b is less than an absorbance of the first pixel defining portion 301a. The absorbance of the second pixel defining portion 301b and the absorbance of the second pixel defining layer 32 can be same or different. In order to simplify manufacturing processes, the absorbance of the second pixel defining portion 301b and the absorbance of the second pixel defining layer 32 are same. The present application does not limit an arrangement of the first pixel defining portion 301a and the second pixel defining portion 301b. For a light transmission and a uniform display, the first pixel defining portion 301a and the second pixel defining portion 301b can be alternately arranged in rows in a first direction D1, and two adjacent rows can be arranged at intervals in a second direction D2 to form a matrix.

In a specific embodiment, in order to simplify manufacturing processes, the first pixel defining portion 301a, the second pixel defining portion 301b, and the second pixel defining layer 32 are made of a same material. The thickness h2 of the second pixel defining layer 32 and a thickness h3 of the first pixel defining portion 301a are same. A thickness h4 of the second pixel defining portion 301b is less than the thickness h3 of the first pixel defining portion 301a. The thickness h2 of the second pixel defining layer 32 is equal to the thickness h3 of the first pixel defining portion 301a. Alternatively, the first pixel defining portion 301a and the second pixel defining portion 301b are made of different materials. The absorbance of the second pixel defining portion 301b is less than the absorbance of the first pixel defining portion 301a. The thickness h3 of the first pixel defining portion 301a and the thickness h4 of the second pixel defining portion 301b can be same or different. In order to simplify manufacturing processes, the thickness h3 of the first pixel defining portion 301a and the thickness h4 of the second pixel defining portion 301b are same. In addition, the second pixel defining portion 301b and the second pixel defining layer 32 have a same material, thickness, and absorbance.

The light-emitting pixel layer 40 includes a plurality of light-emitting pixels 41. Each of the light-emitting pixels 41 is disposed in each of the openings. Each of the light-emitting pixels 41 includes an organic light-emitting diode device. The organic light-emitting diode device includes an anode, a cathode, and a hole injection layer, a hole transport layer, an organic light emitting layer, an electron transport layer, and an electron injection layer positioned between the anode and the cathode. The light-emitting pixels 41 can be arranged in a matrix. It can be understood that the pixel defining layer 30 of the present application is further provided with spacers PS. The spacers PS are configured to support the light-emitting pixels 41 during vapor deposition.

The encapsulation layer 50 is disposed on a side of the light-emitting pixel layer 40 away from the pixel defining layer 30. In an embodiment, the encapsulation layer 50 is a thin-film encapsulation layer (TFE). The thin-film encapsulation layer 50 includes at least one inorganic layer and at least one organic layer alternately stacked. The inorganic layer can be selected from inorganic materials such as aluminum oxide, silicon oxide, silicon nitride, silicon oxynitride, silicon carbide, titanium oxide, zirconium oxide, and zinc oxide. The organic layer is selected from transparent organic materials such as epoxy resin, polyimide, polyethylene terephthalate, polycarbonate, polyethylene (PE), and polyacrylate.

The touch control module 60 is a direct on-cell touch (DOT) module. The touch control module 60 can be a self-capacitive touch control module or a mutual-capacitive touch control module. The touch control module 60 is positioned in the main display region 100b.

The color filter layer 70 is disposed on a side of the encapsulation layer 50 away from the touch control module 60. The color filter layer 70 includes red (R), green (G), and blue (B) color filters 71. Based on self-luminous characteristics of the OLED, each of the color filters corresponds to red, green, and blue light-emitting pixels 41 of the OLED. There is a gap 70a between two adjacent color filters 71. It should be explained that in the transparent display region 100a, a black matrix BM is not provided in the gap 70a between the two adjacent color filters 71. Each of the pixel defining portions 301 of the pixel defining layer 30 corresponds to the gap 70a between two adjacent color filters 71. In prior art, a black matrix positioned between two color filters blocks viewing angles and makes its optical performance, such as color matching, deteriorate. The present application replaces the black matrix with the pixel defining layer 30, which can increase the viewing angles and the optical performance, and save a manufacturing process of the black matrix. The color filter layer 70 further includes the black matrix BM. The black matrix BM is positioned in the main display region 100b and is filled in the gap 70a between the two adjacent color filters 71. The touch control module 60 is generally composed of a metal grid, which easily reflects ambient light and causes a display quality to decrease. Therefore, in the present application, the touch control module 60 is not provided in the transparent display region 100a, and only the touch control module 60 is provided in the main display region 100b. In the transparent display region 100a, because the touch control module 60 is eliminated, there is no need to dispose the black matrix BM for light-shielding between the color filters 71. In the main display region 100b, in order to prevent a reflection of the touch control module 60, the black matrix BM for light-shielding is disposed between the color filters 71.

The planarization layer 80 covers a side of the color filter layer 70 away from the encapsulation layer 50. In the transparent display region 100a, the planarization layer 80 is filled in the gap 70a of the color filter layer 70. In the transparent display region 100a, the color filter layer 70 and the planarization layer 80 together form a POL-less structure of the present application to replace the polarizer. A material of the planarization layer 80 is an organic material, such as acrylic resin or perfluoroalkoxy resin (PFA). In the main display region 100b, the planarization layer 80 covers the color filters 71 on the black matrix BM. In addition, an opening ODH is further provided in the bending region 100c, and the opening ODH is filled with the planarization layer 80.

The photosensitive module 101 is disposed on a side of the substrate 10 away from the driving circuit layer 20. Specifically, the photosensitive module 101 includes a fingerprint recognition sensor, a camera, a structured-light sensor, a time-of-flight sensor, a distance sensor, etc. These sensors can collect signals through the transparent display region, so that the display device 100 can realize under-screen sensing solutions such as an under-screen fingerprint recognition, an under-screen camera, an under-screen face recognition, an under-screen distance sensing.

The display device of the present application includes the transparent display region and the main display region. The main display region is adjacent to the transparent display region. The display device further includes the substrate, the pixel defining layer, and the light-emitting pixels. The pixel defining layer is disposed on the substrate. The pixel defining layer is defined with the openings. The pixel defining layer includes the first pixel defining layer and the second pixel defining layer. The first pixel defining layer is positioned in the transparent display region. The second pixel defining layer is positioned in the main display region. The absorbance of the first pixel defining layer is less than the absorbance of the second pixel defining layer. The light-emitting pixels are disposed in the openings. The display device of the present application increases the light transmittance of the transparent display region by reducing the absorbance of the pixel defining layer in the transparent display region, thereby enhancing a performance of the photosensitive module.

Figure 8:
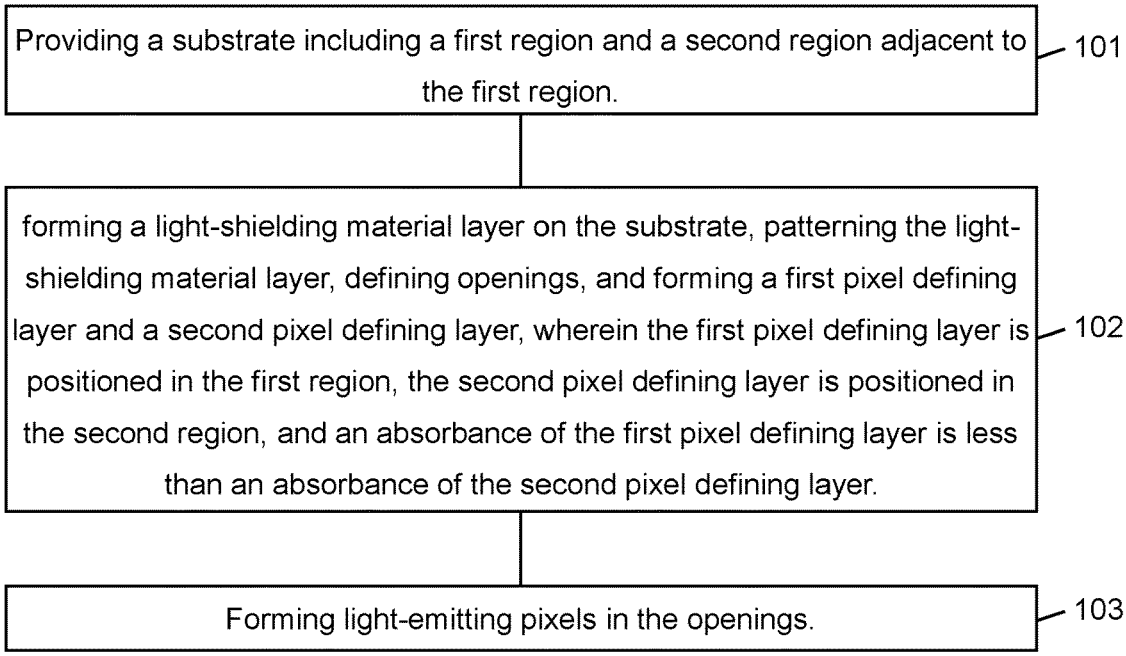
FIG. 8 is a flowchart of a manufacturing method of the display device of the present application.

Please refer to FIG. 8, which is a flowchart of a manufacturing method of the display device of the present application. The manufacturing method of the display device includes steps of:

101: providing a substrate including a first region and a second region adjacent to the first region;

102: forming a light-shielding material layer on the substrate, patterning the light-shielding material layer to form a pixel defining layer, and defining openings in the pixel defining layer, wherein the pixel defining layer includes a first pixel defining layer and a second pixel defining layer, the first pixel defining layer is positioned in the first region, the second pixel defining layer is positioned in the second region, and an absorbance of the first pixel defining layer is less than an absorbance of the second pixel defining layer; and In step 102, a material of the pixel defining layer is a black matrix material commonly used in the art. The material of the pixel defining layer 30 is mainly composed of a thermosensitive and photosensitive polymer and a black filler. The thermosensitive and photosensitive polymer can be acrylic resin or methacrylic resin, and the black filler can be a carbon black material, an organic light-absorbing material, etc. Please refer to FIG. 3. An absorbance of the first pixel defining layer 31 is less than an absorbance of the second pixel defining layer 32. Furthermore, a ratio of the absorbance of the first pixel defining layer 31 to the absorbance of the second pixel defining layer 32 ranges from one-third to three-quarters. Specifically, the ratio of the absorbance of the first pixel defining layer 31 to the absorbance of the second pixel defining layer 32 is one-third, one-half, two-thirds, or three-quarters. In an embodiment, the photosensitive module 101 is a camera. The ratio of the absorbance of the first pixel defining layer 31 to the absorbance of the second pixel defining layer 32 is within a range from one-half to two-thirds. In order to meet requirements of both POL-less and under-screen sensing technologies, a difference between a reflectance of the first pixel defining layer 31 and a reflectance of the second pixel defining layer 32 is less than or equal to two percent.

In order to solve a problem of a low light transmittance of the transparent display region 100a, the absorbance and the reflectance of the first pixel defining layer 31 and the absorbance and the reflectance of the second pixel defining layer 32 can be adjusted by configuring the thickness h1 of the first pixel defining layer 31 and the thickness h2 of the second pixel defining layer 32. In an embodiment, a material of the first pixel defining layer 31 and a material of the second pixel defining layer 32 are same, and the thickness h1 of the first pixel defining layer 31 is less than the thickness h2 of the second pixel defining layer 32. Furthermore, a ratio of the thickness h1 of the first pixel defining layer 31 to the thickness h2 of the second pixel defining layer 32 ranges from one-third to three-quarters. Specifically, the ratio of the thickness h1 of the first pixel defining layer 31 to the thickness h2 of the second pixel defining layer 32 is one-third, one-half, two-thirds, or three-quarters. In this embodiment, the light-shielding material layer can be patterned by a halftone mask or a grayscale mask.

In another embodiment of the present application, the absorbance and the reflectance of the first pixel defining layer 31 and the absorbance and the reflectance of the second pixel defining layer 32 can be adjusted by selecting the materials of the first pixel defining layer 31 and the second pixel defining layer 32. In order to make the absorbance of the first pixel defining layer 31 less than the absorbance of the second pixel defining layer 32, the material of the first pixel defining layer 31 and the material of the second pixel defining layer 32 are different, and the absorbance of the material of the first pixel defining layer 31 is less than the absorbance of the material of the second pixel defining layer 32. Specifically, the thickness of the first pixel defining layer 31 and the thickness of the second pixel defining layer 32 can be same or different. Please refer to FIG. 5, which is a schematic diagram of a partial cross-sectional view of a display device provided by another embodiment of the present application. In order to simplify manufacturing processes, the thickness of the first pixel defining layer 31 and the thickness of the second pixel defining layer 32 are same.

In yet another embodiment of the present application, the absorbance and the reflectance of the first pixel defining layer 31 can be adjusted by designing a structure of the first pixel defining layer 31. In order to make the absorbance of the first pixel defining layer 31 less than the absorbance of the second pixel defining layer 32, the pixel defining layer 30 includes a plurality of pixel defining portions 301. Each of the pixel defining portions 301 includes a first pixel defining portion 301a and a second pixel defining portion 301b arranged on the substrate 10. An absorbance of the second pixel defining portion 301b is less than an absorbance of the first pixel defining portion 301a. The absorbance of the second pixel defining portion 301b and the absorbance of the second pixel defining layer 32 can be same or different. In order to simplify manufacturing processes, the absorbance of the second pixel defining portion 301b and the absorbance of the second pixel defining layer 32 are same. The present application does not limit an arrangement of the first pixel defining portion 301a and the second pixel defining portion 301b. For a light transmission and a uniform display, the first pixel defining portion 301a and the second pixel defining portion 301b can be alternately arranged in rows in a first direction D1, and two adjacent rows can be arranged at intervals in a second direction D2 to form a matrix.

In a specific embodiment, in order to simplify manufacturing processes, the first pixel defining portion 301a, the second pixel defining portion 301b, and the second pixel defining layer 32 are made of a same material. The thickness h2 of the second pixel defining layer 32 and a thickness h3 of the first pixel defining portion 301a are same. A thickness h4 of the second pixel defining portion 301b is less than the thickness h3 of the first pixel defining portion 301a. The thickness h2 of the second pixel defining layer 32 is equal to the thickness h3 of the first pixel defining portion 301a. Alternatively, the first pixel defining portion 301a and the second pixel defining portion 301b are made of different materials. The absorbance of the second pixel defining portion 301b is less than the absorbance of the first pixel defining portion 301a. The thickness h3 of the first pixel defining portion 301a and the thickness h4 of the second pixel defining portion 301b can be same or different. In order to simplify manufacturing processes, the thickness h3 of the first pixel defining portion 301a and the thickness h4 of the second pixel defining portion 301b are same. In addition, the second pixel defining portion 301b and the second pixel defining layer 32 have a same material, thickness, and absorbance. Similarly, the halftone mask or the grayscale mask can be configured to obtain the first pixel defining portion 301a and the second pixel defining portion 301b with different thicknesses.

103: forming light-emitting pixels in the openings.

Figure 9A:
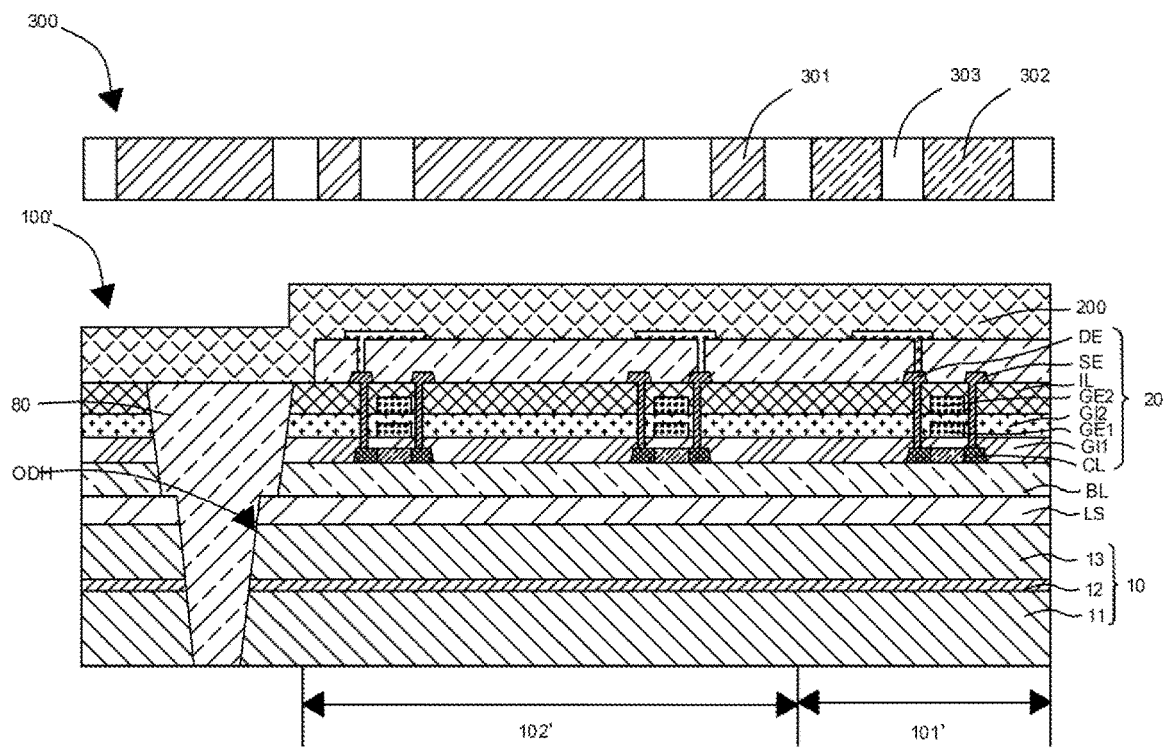
FIGS. 9(a) and 9(b) are schematic diagrams of specific examples of the manufacturing method of the display device of the present application.
Figure 9B:
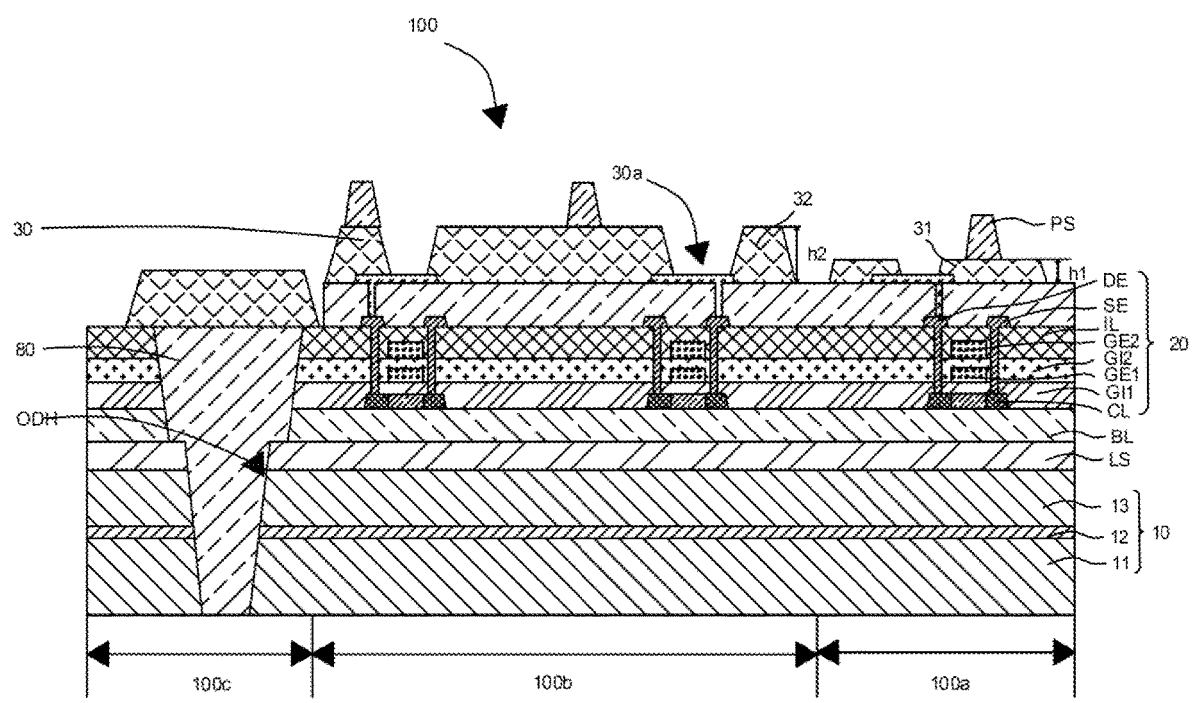

Please refer to FIGS. 9(a) and 9(b), which are schematic diagrams of specific examples of the manufacturing method of the display device of the present application. The manufacturing method of the display device includes the following steps.

201: providing a prepared substrate 100'. The prepared substrate 100' includes a first region 101' and a second region 102'. The second region 102' is adjacent to the first region 101'. The first region 101' corresponds to the transparent display region 100a of the display device. The second region 102' corresponds to the main display region 100b. The prepared substrate 100' includes the substrate 10, the driving circuit layer 20, and an anode layer of the organic light-emitting diode device.

Please refer to the embodiment shown in FIG. 1 for a structure of the substrate 10 and the driving circuit layer 20. A thickness of the first polyimide layer 11 is 10 microns. A thickness of the blocking layer 12 is 500 nanometers. A thickness of the second polyimide layer 13 is 6 microns. A thickness of the buffer layer BL is 500 nanometers. A thickness of the active layer CL is 45 nanometers. A thickness of the first gate insulating layer GI1 is 130 nanometers. A thickness of the first gate GE 1 is 250 nanometers. A thickness of the second gate insulating layer GI2 is 130 nanometers. A thickness of the second gate GE2 is 250 nanometers. A thickness of the interlayer insulating layer IL is 500 nanometers. A thickness of the source SE and the drain DE is 600 nanometers, and they are made of Ti/Al/Ti laminated metal. A thickness of the anode layer is 140 nanometers. A depth of the opening ODH is 1.5 microns.

202: forming a light-shielding material layer 200 on the prepared substrate 100' and patterning the light-shielding material layer 200 to obtain the pixel defining layer 30. The pixel defining layer 30 is defined with the openings 30a. The pixel defining layer 30 includes the first pixel defining layer 31 and the second pixel defining layer 32. The first pixel defining layer is positioned in the first region 101'. The second pixel defining layer 32 is positioned in the second region 102'. The absorbance of the first pixel defining layer 31 is less than the absorbance of the second pixel defining layer 32.

Specifically, a thickness of the light-shielding material layer 200 can be 1.5 microns. The light-shielding material layer 200 is exposed and developed by a mask 300 to form the pixel defining layer 30. The mask 300 includes a light-shielding region 301, a semi-transmitting region 302, and a light-transmitting region 303. The semi-transmitting region 302 corresponds to the transparent display region 100a.

203: forming the spacers PS by coating, exposure, and development processes.

204: referring to FIG. 2, forming the light-emitting pixel layer 40, the encapsulation layer 50, and the touch control module 60 on the pixel defining layer 30 and the spacers PS. The touch control module 60 can include a first insulating layer made of silicon nitride with a thickness of 300 nanometers, a first metal layer made of Ti/Al/Ti lamination with a thickness of 50/200/80 nanometers, a second insulating layer made of silicon nitride with a thickness of 300 nanometers, and a second metal layer made of Ti/Al/Ti lamination with a thickness of 50/200/50 nanometers.

205: uniformly coating a layer of a low-temperature red color resist material and followed by exposure and development processes to form a red color resist, sequentially forming a green color resist and a blue color resist with a same method above to obtain the color filter layer 70, and uniformly coating a layer of a low-temperature organic material on a surface of the color filter layer 70 and followed by exposure and development processes to obtain the planarization layer 80.

The manufacturing method of the display device of the present application increases the light transmittance of the transparent display region by reducing the absorbance of the pixel defining layer in the transparent display region, thereby enhancing the performance of the photosensitive module.

The present application is described in detail above, the specific examples of this document are used to explain principles and embodiments of the present application, and the description of embodiments above is only for helping to understand the present application. Meanwhile, those skilled in the art will be able to change the specific embodiments and the scope of the present application according to the idea of the present application. In the above, the content of the specification should not be construed as limiting the present application. Above all, the content of the specification should not be the limitation of the present application.

What is claimed is:

1. A display device, comprising:
   a transparent display region;
   a main display region adjacent to the transparent display region;
   a substrate;
   a pixel defining layer disposed on the substrate and defined with openings, wherein the pixel defining layer comprises a first pixel defining layer and a second pixel defining layer, the first pixel defining layer is positioned in the transparent display region, the second pixel defining layer is positioned in the main display region, and an absorbance of the first pixel defining layer is less than an absorbance of the second pixel defining layer; and
   light-emitting pixels disposed in the openings,
   wherein a ratio of the absorbance of the first pixel defining layer to the absorbance of the second pixel defining layer ranges from one-half to two-thirds,
   wherein an absolute value of a difference between a reflectance of the first pixel defining layer and a reflectance of the second pixel defining layer is less than or equal to two percent.

2. The display device according to claim 1, wherein a thickness of the first pixel defining layer is less than a thickness of the second pixel defining layer.

3. The display device according to claim 2, wherein a ratio of the thickness of the first pixel defining layer to the thickness of the second pixel defining layer ranges from one-half to two-thirds.

4. The display device according to claim 1, wherein a material of the first pixel defining layer and a material of the second pixel defining layer are different, and an absorbance of the material of the first pixel defining layer is less than an absorbance of the material of the second pixel defining layer.

5. The display device according to claim 1, wherein the first pixel defining layer comprises a first pixel defining portion and a second pixel defining portion disposed on the substrate, and an absorbance of the second pixel defining portion is less than an absorbance of the first pixel defining portion.

6. The display device according to claim 5, wherein the absorbance of the second pixel defining layer is equal to the absorbance of the first pixel defining portion.

7. The display device according to claim 1, further comprising:

an encapsulation layer disposed on a side of the light-emitting pixels away from the pixel defining layer;

a color filter layer disposed on a side of the encapsulation layer away from the light-emitting pixels, wherein the color filter layer comprises a plurality of color filters, the pixel defining layer comprises a plurality of pixel defining portions, and each of the pixel defining portions corresponds to a gap between two adjacent color filters; and a planarization layer covering a side of the color filter layer away from the encapsulation layer, wherein the planarization layer is filled in the gap in the transparent display region.

8. The display device according to claim 7, further comprising a touch control module, wherein the touch control module is positioned in the main display region and is disposed between the encapsulation layer and the color filter layer; and wherein the color filter layer further comprises a black matrix positioned in the main display region and filled in the gap between two adjacent color filters.

9. A manufacturing method of a display device, comprising steps of:

providing a substrate comprising a first region and a second region adjacent to the first region;

forming a light-shielding material layer on the substrate, patterning the light-shielding material layer to form a pixel defining layer, and defining openings in the pixel defining layer, wherein the pixel defining layer comprises a first pixel defining layer and a second pixel defining layer, the first pixel defining layer is positioned in the first region, the second pixel defining layer is positioned in the second region, and an absorbance of the first pixel defining layer is less than an absorbance of the second pixel defining layer; and forming light-emitting pixels in the openings, wherein a ratio of the absorbance of the first pixel defining layer to the absorbance of the second pixel defining layer ranges from one-half to two-thirds, wherein an absolute value of a difference between a reflectance of the first pixel defining layer and a reflectance of the second pixel defining layer is less than or equal to two percent.

10. The manufacturing method of the display device according to claim 9, wherein in the step of forming the light-shielding material layer on the substrate, patterning the light-shielding material layer to form the pixel defining layer, and defining the openings in the pixel defining layer comprises a step of:

obtaining the first pixel defining layer and the second pixel defining layer with different thicknesses by a halftone mask or a grayscale mask, wherein a thickness of the first pixel defining layer is less than a thickness of the second pixel defining layer.

11. The manufacturing method of the display device according to claim 10, wherein a ratio of the thickness of the first pixel defining layer to the thickness of the second pixel defining layer ranges from one-half to two-thirds.

12. The manufacturing method of the display device according to claim 9, wherein a material of the first pixel defining layer and a material of the second pixel defining layer are different, and an absorbance of the material of the first pixel defining layer is less than an absorbance of the material of the second pixel defining layer.

13. The manufacturing method of the display device according to claim 9, wherein the first pixel defining layer comprises a first pixel defining portion and a second pixel defining portion disposed on the substrate, and an absorbance of the second pixel defining portion is less than an absorbance of the first pixel defining portion.

14. The manufacturing method of the display device according to claim 13, wherein the absorbance of the second pixel defining layer is equal to the absorbance of the first pixel defining portion.

15. The manufacturing method of the display device according to claim 9, wherein after the step of forming the light-emitting pixels in the openings, the manufacturing method of the display device further comprises steps of:

forming an encapsulation layer on a side of the light-emitting pixels away from the pixel defining layer;

forming a color filter layer on a side of the encapsulation layer away from the light-emitting pixels, wherein the color filter layer comprises a plurality of color filters, the pixel defining layer comprises a plurality of pixel defining portions, and each of the pixel defining portions corresponds to a gap between two adjacent color filters; and forming a planarization layer on a side of the color filter layer away from the encapsulation layer, wherein the planarization layer is filled in the gap in the first region.

16. The manufacturing method of the display device according to claim 15, wherein after the step of forming the encapsulation layer on the side of the light-emitting pixels away from the pixel defining layer and before the step of forming the color filter layer on the side of the encapsulation layer away from the light-emitting pixels, the manufacturing method of the display device further comprises a step of:

forming a touch control module in the first region, wherein the touch control module is disposed between the encapsulation layer and the color filter layer.

* * * * *